United States Patent
Hoebel et al.

(10) Patent No.: US 8,219,337 B2
(45) Date of Patent: Jul. 10, 2012

(54) ARRANGEMENT FOR DETERMINING THE OPERATIONAL PARAMETERS OF A HIGH-FREQUENCY POWER AMPLIFIER

(75) Inventors: Daniel Hoebel, Bad Woerishofen (DE); Hendrik Koehler, Hallbergmoos (DE); Bernd Weigenthaler, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 576 days.

(21) Appl. No.: 12/307,513

(22) PCT Filed: Jun. 1, 2007

(86) PCT No.: PCT/EP2007/004887
§ 371 (c)(1),
(2), (4) Date: Apr. 15, 2009

(87) PCT Pub. No.: WO2008/003376
PCT Pub. Date: Jan. 10, 2008

(65) Prior Publication Data
US 2009/0210180 A1   Aug. 20, 2009

(30) Foreign Application Priority Data
Jul. 5, 2006 (DE) .......................... 10 2006 031 046

(51) Int. Cl.
*G01R 27/00* (2006.01)
*G06F 17/40* (2006.01)

(52) U.S. Cl. ................ 702/65; 702/64; 702/60; 702/57; 324/600

(58) Field of Classification Search .................... 702/65, 702/64, 60, 57
See application file for complete search history.

(56) References Cited

U.S. PATENT DOCUMENTS

| | | | | |
|---|---|---|---|---|
| 2,157,523 A | * | 5/1939 | Buschbeck | 331/76 |
| 5,564,086 A | * | 10/1996 | Cygan et al. | 455/126 |
| 5,898,338 A | * | 4/1999 | Proctor et al. | 330/149 |
| 7,254,511 B2 | * | 8/2007 | Niedzwiecki et al. | 702/118 |
| 2003/0111997 A1 | * | 6/2003 | McMorrow | 324/95 |
| 2005/0195919 A1 | * | 9/2005 | Cova | 375/297 |

(Continued)

FOREIGN PATENT DOCUMENTS

DE  27 10 752 A1  9/1978

(Continued)

OTHER PUBLICATIONS

International Search Report, WO 2008/003376 A1, Rohde & Schwarz GmbH & Co. KG, Jan. 10, 2008, pp. 12-16.

(Continued)

*Primary Examiner* — Hal Wachsman
(74) *Attorney, Agent, or Firm* — Ditthavong Mori & Steiner, P.C.

(57) ABSTRACT

In order to determine the operational parameters of a high-frequency power amplifier (1) (for example, complex forward and return voltage or power, complex load impedance, reflection or voltage standing wave ratio) on the connecting line (3) between the output of the high-frequency power amplifier (1) and a complex load, in particular, an antenna (4), an analog measured voltage $U_u$ proportional to the complex voltage $\vec{U}$ on the connecting line and an analog measured voltage $U_i$ proportional to the complex current $\vec{I}$ on the line (3) is determined by a Buschbeck coupling device. These measured voltages are digitized, and the required operational parameters can then be calculated in a computing unit (7) from these digital values.

21 Claims, 2 Drawing Sheets

$\vec{U}$  $\vec{I}$ : Complex voltage or current on the line
$Z_L$ : Characteristic impedance of the line
$\vec{Z}$ : Complex terminating resistance
$\vec{K} = K \cdot U_U$  K = Proportionality factor
$\vec{I} = m \cdot U_i$  m = Proportionality factor

U.S. PATENT DOCUMENTS

2006/0280261 A1 * 12/2006 Prikhodko et al. ............ 375/297

FOREIGN PATENT DOCUMENTS

| DE | 39 18 159 | A1 | 12/1990 |
|----|-----------|----|---------|
| DE | 4239740 | C1 | 6/1994 |
| DE | 19927063 | B4 | 3/2005 |
| EP | 0 401 545 | A1 | 12/1990 |
| EP | 0 753 876 | B1 | 1/1997 |
| EP | 1 732 231 | A2 | 12/2006 |
| EP | 1732231 | A2 | 12/2006 |
| EP | 1 732 231 | A3 | 10/2007 |
| JP | 2006258763 | A | 9/2006 |

OTHER PUBLICATIONS

International Preliminary Report on Patentability, PCT/EP2007/004887, Feb. 19, 2009, pp. 1-12.

Meinke/Grundlach, Taschenbuch der Hochfrequenztechnik, 3rd print, pp. 1560-1561, Jan. 1, 1968 (English translation included).

* cited by examiner $\vec{U}$  $\vec{I}$ : Complex voltage or current on the line $Z_L$ : Characteristic impedance of the line $\vec{Z}$ : Complex terminating resistance $\vec{K} = K \cdot U_u$  K = Proportionality factor $\vec{I} = m \cdot U_i$  m = Proportionality factor

FIG. 2
BACKGROUND ART $$\vec{U}_V = \vec{U} + I \cdot Z_L = K \cdot \vec{U}_u + m \cdot \vec{U}_i \cdot Z_L \quad (1)$$

$$\vec{U}_R = \vec{U} - I \cdot Z_L = K \cdot \vec{U}_u - m \cdot \vec{U}_i \cdot Z_L \quad (2)$$

$$\vec{P}_V = \frac{\vec{U}_V^2}{Z_L} \quad (3)$$

$$\vec{P}_R = \frac{\vec{U}_R^2}{Z_L} \quad (4)$$

$$\vec{Z} = \frac{\vec{U}}{\vec{I}} = \frac{K \cdot \vec{U}_u}{m \cdot \vec{U}_i} \quad (5)$$

$$\vec{r} = \frac{\frac{\vec{U}}{\vec{I}} - Z_L}{\frac{\vec{U}}{\vec{I}} + Z_L} = \frac{\frac{K \cdot \vec{U}_u}{m \cdot \vec{U}_i} - Z_L}{\frac{K \cdot \vec{U}_u}{m \cdot \vec{U}_i} + Z_L} \quad (6)$$

$$s = \frac{\vec{U}_{max}}{\vec{U}_{min}} = \frac{\vec{U}_V}{\vec{U}_R} \quad (7)$$

ARRANGEMENT FOR DETERMINING THE OPERATIONAL PARAMETERS OF A HIGH-FREQUENCY POWER AMPLIFIER

CROSS-REFERENCE TO RELATED APPLICATIONS

The present application claims priority to German Patent Application No. DE 10 2006 031 046.2, filed on Jul. 5, 2006, and is a national filing of PCT Application No. PCT/EP2007/004887, filed on Jun. 1, 2007, the entire contents of which are herein incorporated by reference.

BACKGROUND OF THE INVENTION

1. Field of the Invention

The invention relates to high-frequency power amplifiers and operational parameters thereof.

2. Discussion of the Background

In the operation of high-frequency power amplifiers, for example, transistor power output stages of variable-frequency shortwave transmitters, it is necessary to determine and monitor various operational parameters, in particular, the matching of the load and the power. Various analog arrangements for this purpose are known from DE 27 10 752 A1 and respectively DE 39 18 159 A1. They have in common the fact that, for the determination of the operational parameters on the connecting line between the power amplifier and the antenna, directional couplers are used, and the calculation of the required operational parameters from the analog forward and respectively return voltage obtained by means of the directional coupler, which is proportional respectively to the forward and return wave on the connecting line, is implemented in an analog manner through correspondingly-complex analog circuits.

SUMMARY OF THE INVENTION

An object of the invention is to provide an arrangement of this kind, with which this determination of the operational parameters of a high-frequency power amplifier is possible more accurately and in a considerably-simpler and more cost-favourable manner.

According to the invention, in order to obtain the measured values on the connecting line between the power amplifier and the antenna necessary for calculating the required operational parameters, a per-se known coupling device according to Buschbeck (Meinke/Grundlach, Taschenbuch der Hochfrequenztechnik, (Manual of High-Frequency Technology) $3^{rd}$ edition, pages 1560-1561) is used, which provides the advantage that, independently of the position of its installation on the line, measured voltages are obtained, which are proportional to the complex voltage or respectively to the complex current on the line.

These complex, analog measured voltages obtained in this manner are digitized according to the invention and, from these digital values, the various required operational parameters, such as the complex forward and return voltage, complex forward and return power, the complex load impedance of the antenna, the reflection factor and the voltage standing wave ratio, on the connecting line between the output of the high-frequency power amplifier and the antenna, which is generally formed as a coaxial line, can then be calculated in a computing unit using appropriate, known algorithms.

With the arrangement according to the invention, not only the above named operational parameters of a high-frequency power amplifier mentioned above by way of example can be determined, but other calculations, which are useful for the operation of the power amplifier, can also be implemented using appropriate, known algorithms with the digital values made available to the computing unit. For example, the digitized measured voltage proportional to the complex voltage on the line can be digitally demodulated by means of a known algorithm, and, in fact, according to the demodulation mode, which corresponds to the modulation mode for the generation of the high-frequency signal amplified via the power amplifier, for example, an amplitude modulation, frequency modulation or phase modulation or any other higher-value type of modulation required.

The useful signal at the output of the power amplifier digitally demodulated in this manner can then be fed back to the input of the radio system for qualitative evaluation of the output signal and made audible there, for example, by means of a monitoring loudspeaker. In this manner, a so-called sidetone signal can be generated, with which the speaking comfort, for example, of a shortwave telephony radio system can be monitored and improved. This possibility of feeding back the own speech is superior to the previously-used, direct feedback after the microphone amplifier to a monitoring loudspeaker, because all of the stages of the radio system including the output amplifier are also evaluated. This possibility of demodulation of the useful signal directly at the base of the antenna can also be used advantageously for monitoring in CW mode or respectively in the transmission of digital signals.

Another possibility is to determine, from the digital values supplied to the computer, which correspond to the complex forward voltage, the distortions of the output stage caused by non-linearity. Accordingly, the useful signal supplied to the power amplifier can be pre-distorted before amplification in the known manner in the opposite direction to the distortion, so that the distortions in the power amplifier are compensated. This determination of the distortion in the output stage can also be monitored constantly during operation, so that, for example, even with a change of load, the connection of another antenna or in the case of a frequency change, the system is automatically linearized via a corresponding change of the pre-distortion.

Any conventional signal processor or, for special tasks, a so-called field-programmable gate array (FPGA), with which, the above-described digital calculations can be made at low cost, for example, according to the so-called Cordic algorithm, is suitable as the computing unit.

BRIEF DESCRIPTION OF THE DRAWINGS

The invention is explained in greater detail below on the basis of exemplary embodiments with reference to a schematic drawing and exemplary calculation formulae (1) to (7). The drawings are as follows:

FIG. 2 shows exemplary background formulae (1) to (7).

DETAILED DESCRIPTION OF EXEMPLARY EMBODIMENTS OF THE INVENTION

Figure 1:
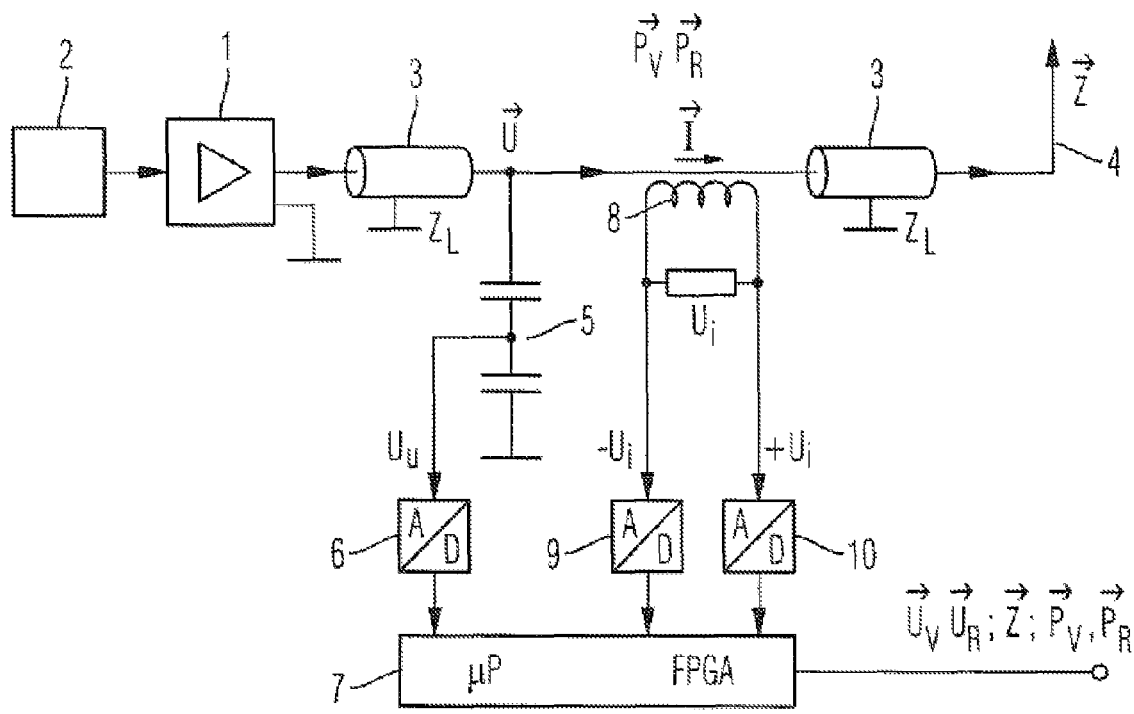
FIG. 1 shows the outline circuit diagram of a shortwave power output stage with further development according to the invention.

FIG. 1 shows the outline circuit diagram of a shortwave power output stage with a high-frequency power amplifier 1, to which the useful signal to be amplified is supplied from a control and modulation device 2. The output of the power amplifier 1 supplies an antenna 4 via a coaxial connecting line 3. At an arbitrary position on this connecting line 3, the outer conductor is interrupted and, via a capacitive voltage divider 5 connected directly to the inner conductor of the coaxial line 3, a measured voltage $U_u$ proportional to the complex voltage $\vec{U}$ is obtained according to Buschbeck. This is digitized in an analog/digital converter 6 and supplied to a computing unit 7. By means of a current converter 8 allocated to the inner conductor of the coaxial line 3, a measured voltage $U_i$ corresponding to the complex current $\vec{I}$ on the line is obtained at a resistor. The analog measured value is supplied via an analog/digital converter 9, and the measured value $+U_i$ is supplied via an analog/digital converter 10 to the computing unit 7. Since the two voltage values $+U_i$ and $-U_i$ obtained are disposed perpendicular to one another, only a single analog/digital converter 9 or 10 may optionally also be used, and the corresponding other value can then be calculated directly in the computer 7, so that one analog/digital converter is saved. The computer 7 is, for example, an FPGA.

According to known formulae of line theory, as described, for example, in the textbook by Meinke/Grundlach, Taschenbuch der Hochfrequenztechnik, an extremely diverse range of operational parameters of the power amplifier 1 can be determined in the computer 7 from the digitized voltages $U_u$ and respectively $U_i$, which are proportional to the complex voltages $\vec{U}$ or respectively the current $\vec{I}$ on the line, and in which the phase information of the complex voltage or respectively current also remains preserved after digitisation. The proportionality between the voltages $U_a$ and $U_i$ and the complex values $\vec{U}$ and $\vec{I}$ is taken into consideration in each case by proportionality factors k and respectively m, which are determined either empirically through measurement or by simulation.

With reference to FIG. 2, various background formulae of line theory, along with the definitions of the terms employed in the equations, are shown in equations (1) through (7).

For example, the complex forward voltage according to equation (1), or respectively the complex return voltage according to equation (2), or the complex forward power according to equation (3), or respectively the return power according to equation (4) can be calculated from the digitized voltage values $U_a$ and $U_i$. Another possibility is to calculate the complex load impedance $\vec{Z}$ from these voltages according to equation (5). Accordingly, with this known complex load impedance, for example, by adaptive insertion of 50 ohm line portions of different lengths between the power amplifier 1 and antenna 4, the power consumption, inter-modulation and/or the harmonic spacing can be improved, since the complex matching can be optimized through the inserted line portions in such a manner that the power amplifier is operated within an optimum matching range. In this manner, for example, a low-pass character can be generated and operated within a capacitive range, so that the harmonic spacing is improved. Also, the amplification can be optimized in such a manner that the power amplifier can be matched better to its scattering parameters. Accordingly, the efficiency of the power amplifier can be optimized via the calculation of the complex load impedance.

According to equation (6), the complex reflection factor $\vec{r}$, or, according to equation (7), the voltage standing wave ratio s(VSWR) can, for example, also be calculated from the digitized voltage values.

The invention is not restricted to the exemplary embodiment described. All of the elements described or illustrated can be combined with one another as required. As described above, a digital demodulation of the useful signal is also possible, as is the determination of the distortions of the amplifier and the associated, possible linearization through corresponding pre-distortion of the input signal.

The invention claimed is:

1. An arrangement for determining the operational parameters of a high-frequency power amplifier including complex forward and return voltage, complex forward and return power, complex load impedance, complex reflection factor or voltage standing wave ratio, on a connecting line between an output of the high-frequency power amplifier and a complex load, said arrangement comprising:
   a coupling device for determining an analog measured voltage proportional to a complex voltage on the connecting line and an analog measured voltage proportional to a complex current on the connecting line;
   analog/digital converters configured to digitize the measured voltages; and
   a computing unit for calculating any of the operational parameters required for the high-frequency power amplifier from the digital values.

2. The arrangement according to claim 1, wherein the complex forward and/or return voltage is calculated in the computing unit from the digital measured voltages.

3. The arrangement according to claim 2, wherein the complex forward and/or return power is calculated in the computing unit from the digital measured voltages.

4. The arrangement according to claim 2, wherein the complex impedance of the load is calculated in the computing unit from the digital measured voltages.

5. The arrangement according to claim 2, wherein the complex reflection factor is calculated in the computing unit from the digital measured voltages.

6. The arrangement according to claim 2, wherein the voltage standing wave ratio is calculated in the computing unit from the digital measured voltages.

7. The arrangement according to claim 2, wherein, from the digital measured voltage proportional to the complex voltage on the connecting line, a high-frequency signal is digitally demodulated in the computing unit according to a modulation mode, which is used in the generation of the high-frequency signal amplified via the high-frequency power amplifier.

8. The arrangement according to claim 2, wherein, from the digital measured voltages, the complex forward voltage is determined, and from this, the distortion of the high-frequency power amplifier is determined in the computing unit.

9. The arrangement according to claim 8, wherein, from the determined distortion, a corresponding pre-distortion for a high-frequency signal to be amplified is calculated.

10. The arrangement according to claim 2, wherein the coupling device is a coupler according to Buschbeck.

11. The arrangement according to claim 1, wherein the complex forward and/or return power is calculated in the computing unit from the digital measured voltages.

12. The arrangement according to claim 11, wherein the coupling device is a coupler according to Buschbeck.

13. The arrangement according to claim 1, wherein the complex impedance of the load is calculated in the computing unit from the digital measured voltages.

14. The arrangement according to claim 13, wherein the coupling device is a coupler according to Buschbeck.

15. The arrangement according to claim 1, wherein the complex reflection factor is calculated in the computing unit from the digital measured voltages.

16. The arrangement according to claim 1, wherein the voltage standing wave ratio is calculated in the computing unit from the digital measured voltages.

17. The arrangement according to claim 1, wherein, from the digital measured voltage proportional to the complex voltage on the connecting line, a high-frequency signal is digitally demodulated in the computing unit according to a modulation mode, which is used in the generation of the high-frequency signal amplified via the high-frequency power amplifier.

18. The arrangement according to claim 1, wherein, from the digital measured voltages, the complex forward voltage is determined, and from this, the distortion of the high-frequency power amplifier is determined in the computing unit.

19. The arrangement according to claim 18, wherein, from the determined distortion, a corresponding pre-distortion for a high-frequency signal to be amplified is calculated.

20. The arrangement according to claim 1, wherein the coupling device is a coupler according to Buschbeck.

21. An arrangement for determining the operational parameters of a high-frequency power amplifier including complex forward and return voltage, complex forward and return power, complex load impedance, complex reflection factor or voltage standing wave ratio, on a connecting line between an output of the high-frequency power amplifier and a complex load, said arrangement comprising:

a coupling device for determining an analog measured voltage proportional to a complex voltage on the connecting line and an analog measured voltage proportional to a complex current on the connecting line;

analog/digital converters configured to digitize the measured voltages; and a computing unit for calculating any of the operational parameters required for the high-frequency power amplifier from the digital values, wherein, from the digital measured voltage proportional to the complex voltage on the connecting line, a high-frequency signal is digitally demodulated in the computing unit according to a modulation mode, which is used in the generation of the high-frequency signal amplified via the high-frequency power amplifier.

* * * * *